United States Patent [19]
Vora

[11] Patent Number: 4,757,027
[45] Date of Patent: Jul. 12, 1988

[54] METHOD FOR FABRICATING IMPROVED OXIDE DEFINED TRANSISTORS

[75] Inventor: Madhukar B. Vora, Los Gatus, Calif.

[73] Assignee: Fairchild Semiconductor Corporation, Cupertino, Calif.

[21] Appl. No.: 9,773

[22] Filed: Feb. 2, 1987

Related U.S. Application Data

[62] Division of Ser. No. 533,797, Sep. 19, 1983, abandoned.

[51] Int. Cl.⁴ .......................................... H01L 21/385
[52] U.S. Cl. ......................................... 437/39; 437/55; 437/162; 437/239
[58] Field of Search ..................... 437/39, 200, 55, 22, 437/162, 239; 357/15, 34, 21

[56] References Cited

U.S. PATENT DOCUMENTS

| | | | |
|---|---|---|---|
| 3,299,329 | 1/1967 | Pollock | 357/21 X |
| 4,317,686 | 3/1982 | Arnand et al. | 357/91 X |
| 4,338,138 | 6/1982 | Cavaliere et al. | 357/34 X |
| 4,378,630 | 4/1983 | Horng et al. | 357/34 X |
| 4,385,433 | 5/1983 | Ozawa | 437/55 |
| 4,404,737 | 9/1983 | Kanzaki et al. | 437/55 |
| 4,408,388 | 10/1983 | Kameyama et al. | 437/55 X |
| 4,433,470 | 2/1984 | Kameyama et al. | 156/647 X |
| 4,488,350 | 12/1984 | Vora | 357/34 |
| 4,539,742 | 9/1985 | Kanzaki et al. | 437/55 X |

Primary Examiner—George T. Ozaki
Attorney, Agent, or Firm—Lee Patch; James A. LaBarre

[57] ABSTRACT

Two insulating layers may be employed to define boundaries of junctions in transistor structures useful in integrated circuit fabrication. The junctions may overlie one another, have approximately equal areas, and terminate in the insulating layers.

16 Claims, 5 Drawing Sheets

METHOD FOR FABRICATING IMPROVED OXIDE DEFINED TRANSISTORS

This application is a division of application Ser. No. 533,797 filed Sept. 19, 1983, now abandoned.

BACKGROUND OF THE INVENTION

This invention relates to integrated circuits, and in particular to novel transistor structure having junctions bounded by insulating layers. The invention also relates to novel processes for making these structures.

Double-poly transistors are integrated circuit structures in which two layers of poly-silicon are formed on a wafer having an epitaxial layer. In embodiments illustrated, for example in U.S. Pat. No. 4,322,882 to applicant and incorporated by reference herein, the two layers of poly-silicon are of different conductivity types. The structure is treated to cause outdiffusion of the poly-silicon impurities into the epitaxial layer to form junction regions in the epitaxial layer which are self aligned with adjacent poly-silicon layer regions.

Figure 1:
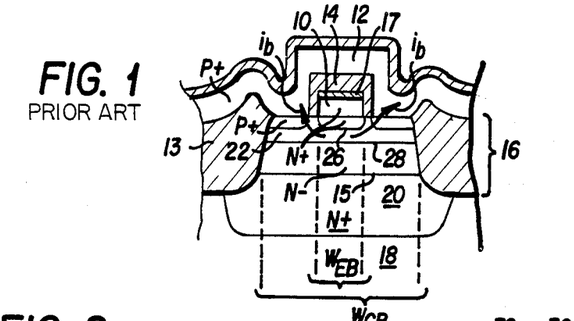
FIG. 1 is a cross-sectional view of a prior art double-poly transistor structure.

An illustrative example of a double-poly transistor structure known in the pior art is shown in FIG. 1. The double-poly structure of FIG. 1 derives its name from two layers of poly-silicon 10 and 12 which are deposited during fabrication. Of particular significance to the present discussion are the location and boundaries of the emitter-base junction and of the collector-base junction, and the base current path $i_b$.

It may be noted from FIG. 1 that the entire boundary of the prior art collector-base junction is defined by a field oxide layer 13, while the boundary of the emitter-base junction is defined by an oxide collar 14. These oxide boundaries are known to reduce junction leakage. The width of the emitter-base junction $W_{EB}$ is significantly smaller than the width of the deeper collector-base junction $W_{CB}$. This results in a significant difference in the areas of the two junctions. The base current paths $i_b$ extend between the field oxide and collar to the poly-silicon layer 12. The length of this path is directly related to the base resistance of the transistor.

The structure shown in FIG. 1 provides a reduced base resistance and junction capacitance as compared to conventional integrated circuit structures. However for smaller, high performance devices, junction capacitance and base resistance become an important factor. In theory, decrease device size, switching time and power consumption could be achieved by making narrower and shallower devices of the structure shown in FIG. 1. Unfortunately, base resistance and junction capacitance do not proportionately scale downward when such narrower and smaller devices are made. In particular, the capacitance of the collector-base junction becomes proportionately greater than the capacitance of the emitter-base junction because of an increasing disparity in the areas of the junctions.

Accordingly, it is an object of the present invention to provide transistor structures in which overlying junctions thereof have small, approximately equal areas.

It is another object of the present invention to provide transistor structures with reduced base resistance.

It is another object of the present invention to provide a vertical transistor structure in which the deeper junction has a smaller area and capacitance.

It is another object of the present invention to produce smaller, high performance vertical transistor structures in which both emitter-base and collector-base junctions have limited leakage.

These and other objects and features will be apparent from this written description when read with the appended drawings.

SUMMARY OF THE INVENTION

The present invention relates to techniques for making essentially vertical, transistor structures in islands of an epitaxial silicon layer surrounded by an insulating field. A first junction is formed in the epitaxial silicon layer, the first junction terminating in a first layer of insulating material. A second junction is formed in the epitaxial silicon layer and this second junction is aligned with the first junction. The second junction may likewise terminate in a second layer of insulating material. In this configuration the insulating layer may define boundaries of the first and second junctions. The boundaries may be selected so that the first and second junctions have approximately equal areas.

In preferred embodiments of the present invention, the first and second insulating layers may be at least partially separated by a base region of the transistor structure. A first poly-silicon extrinsic base region may be employed to reduce base resistance by forming a low resistance path between an intrinsic base region of the transistor structure and a conductor not aligned with the intrinsic base region.

A second poly-silicon layer may be employed to form an intrinsic collector or emitter junction by outdiffusion into the epitaxial silicon layer. Electrical contact to this junction may be made through the poly-silicon.

In other preferred embodiments of the present invention, the first insulating layer may include a first oxide layer which lies generally horizontally in the island and has a generally vertical edge which abuts a first base junction of the transistor stucture to reduce junction leakage. The second insulating layer may include an oxide layer which separates the first and second poly-silicon layers, said second oxide layer having a generally vertical portion with a generally horizontal edge which abuts the second junction, thereby reducing leakage from the second junction.

The above-described structures may be made by novel techniques including the following method. For this method the starting material is a substrate having formed thereon an island of a first conductivity type epitaxial layer. The island may be surrounded by an insulating material. The island may be made of a first conductivity type and the substrate may be made of an opposite conductivity type, the two being separated by an intervening or buried layer of the first conductivity type.

Into this structure a pocket of opposite conductivity type impurity may be introduced to form an intrinsic base region of the transistor. A first poly-silicon layer of the first conductivity type may be deposited onto the surface areas defined by photolithography masking techniques, the surface areas being located with the pocket. A first oxide layer may then be deposited onto exposed surfaces of the first poly-silicon layer. A region of the epitaxial layer may be etched away to expose a generally vertical wall of the epitaxial layer around the oxide layer. A generally horizontal second oxide layer may then be formed anisotropically so as to leave at least partially exposed a portion of the generally vertical wall of the epitaxial layer. A second poly-silicon layer may then be deposited so that it overlies the second oxide layer and so that the second poly-silicon layer contacts the exposed portion of the generally vertical wall of the epitaxial layer. The second poly-silicon layer may contain an impurity of the opposite conductivity type. Finally, the structure may be treated to cause at least some of the impurity in the first poly-silicon layer to enter the pocket and to cause at least some of the impurity in the second poly-silicon layer to enter the epitaxial layer through the exposed, generally vertical wall. These techniques result in the forming of a first junction of the transistor structure, an edge of which terminates in the second oxide layer. A second junction of the transistor structure is also formed, an edge of which terminates in the first oxide layer.

Advantageously the areas of the first and second junctions are defined to be of substantially the same shape and area, with the second junction horizontally overlying the first junction in approximately parallel relationship. Silicide layers may be formed over the poly-silicon layers to increase the electrical conductivity of the contacts to the silicon.

In one embodiment of the present invention, the horizontal second oxide layer may be formed by implanting oxygen anisotropically in the edge area of the epitaxial layer around the first oxide. In alternate embodiments the second oxide layer is formed by selective etching techniques.

These methods and structures may be employed in a multiple collector transistor structure adapted for use in I²L circuit fabrication. In this technique the multiple collector transistor structure is formed in an island of a epitaxial material of a first conductivity type, separated from a substrate region of an opposite conductivity type by an intervening region of a more heavy concentration of an impurity of the first type, the island being surrounded by insulating material extending to contact the intervening region. The transistor structure may include a plurality of spaced apart extrinsic base regions of opposite conductivity type, formed in the island and forming emitter-base junction areas with the epitaxial material of the first conductivity type. Spaced apart insulating regions may be provided which contact the spaced apart instrinsic base regions and define boundaries of the emitter-base junction areas. A plurality of intrinsic base regions of an opposite conductivity, having an impurity concentration less than the extrinsic base region, may be formed, each intrinsic base region being disposed in between the extrinsic base regions. A plurality of intrinsic collector regions may be formed overlying the intrinsic base regions.

BRIEF DESCRIPTION OF THE DRAWINGS

FIG. 2c is a schematic plan view of the structure of FIG. 2a, while

FIGS. 11a through 11d are views of a multiple collector double-poly transistor structure useful in fabricating I²L logic structures in integrated circuits.

DETAILED DESCRIPTION

The present invention relates to novel techniques and structures for the fabrication of transistors in monolithic integrated circuits, and particularly useful in the fabrication of double-poly transistors.

As discussed above, FIG. 1 illustrates an example of a double-poly transistor known in the prior art. That structure will now be described in greater detail as a basis for comparison with the present invention. The double-poly structure of FIG. 1 derives its name from two layers of poly-silicon 10 and 12 which are deposited during fabrication of the device and remain in the finished structure of the device. The poly-silicon layer 109, shown in the example of FIG. 1, is of an N conductivity type while the poly-silicon layer 12 is of a P type. The P type poly-silicon layer 12 forms an extrinsic base of the transistor while the N type poly-silicon layer 10 forms an extrinsic emitter of the device.

The fabrication of a device such as that shown in FIG. 1 is discussed extensively in the art, for example in U.S. Pat. No. 4,322,882 to Vora. These methods of manufacturing include creating an island 15 of the epitaxial layer 16 separated from a substrate 18 by an intervening region 20 of the first conductivity type. The island of the epitaxial layer 16 is surrounded by the field oxide layer 13. An opposite conductivity type impurity is introduced into a first portion 22 of the epitaxial layer 16. The poly-silicon layer 12 of the opposite conductivity type is deposited on the epitaxial layer. The poly-silicon layer 10 and overlying silicide layer 17 are deposited on the epitaxial layer and may be of the first conductivity type. The structure may then be heat treated to cause at least some of the impurities of the polysilicon layers to enter different portions of the epitaxial layer at 24. In particular, the second poly-silicon layer 10 provides impurities which diffuse into the epitaxial layer to form the emitter-base junction at 26.

In the double-poly transistor structure of FIG. 1 using about a 2 micron groundrule, the area of the collector-base junction ($A_{CB}$) is typically three times larger than the area of the emitter-base junction ($A_{EB}$). This proportion changes with reduction in the groundrule.

Turning now to the present invention, it is first noted that, in the structure of the present invention, the area of the collector-base and emitter-base junctions can be made approximately equal. This permits the reduction of the collector-base capacitance and storage charge in the collector-base junction, thereby improving the switching performance of the transistor.

Figure 2A:
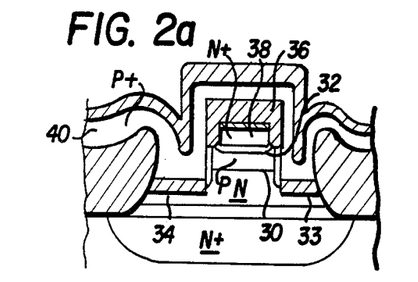
FIGS. 2a and 2b are cross-sectional views of doublepoly transistor structures of embodiments of the present invention.
Figure 2B:
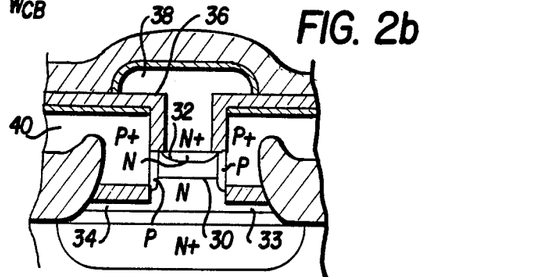

FIGS. 2a and 2b are cross-sectional views of two types of double-poly transistor structures incorporating the teachings of the present invention. Cross-sections of the devices of FIGS. 2a and 2b are taken along planes a—a and presented in FIGS. 2c and 2d, respectively. The transistor structures of FIGS. 2a and 2b each have collector-base junctions 30 and emitter-base junctions 32, formed in epitaxial islands 33. Edges of the collector-base junctions 30 of both transistor structures lie adjacent to a buried oxide layer 34, while edges of the emitter-base junctions 32 lie adjacent to a separate oxide layer 36. Contact to the emitter is made through poly-silicon layer 38, while contact to the base is made through poly-silicon layer 40. In the structure of FIG. 2a the poly-silicon layer 40 partially overlies the poly-silicon layer 38. The opposite is true of the structure of FIG. 2b.

Figure 2C:
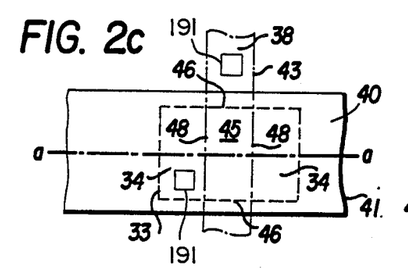
Figure 2D:
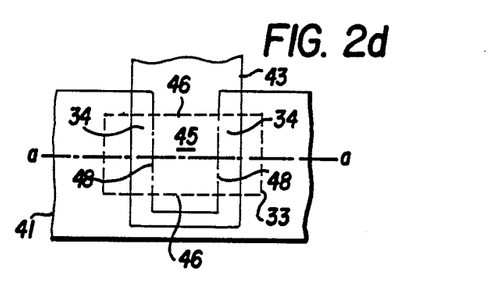
FIG. 2d is a schematic plan view of the structure of FIG. 2b.

The layout of the transistor structures will now be discussed with reference to FIGS. 2c and 2d. In these figures, the island is bounded by dotted line 33. The P+ poly-silicon layer lies within the boundary 41 and the N+ poly-silicon layer lies within the boundary 43.

The boundaries of the collector-base and emitter-base junctions are approximately equal areas, and overlie each other in parallel arrangment in the general area indicated by the numeral 45. End boundaries of the junctions may be defined by field oxide edges 46. Side boundaries of the junctions are defined at about the line 48 by the oxide layers 34 and 36 discussed above.

Figure 3:
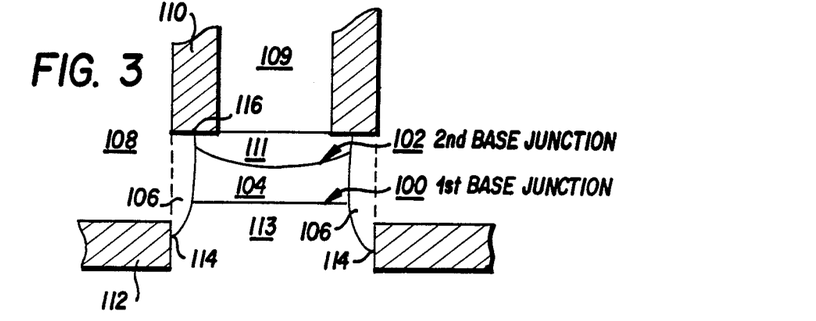
FIG. 3 is a simplified cross-sectional view of a transistor structure illustrating important aspects of the present invention.

FIG. 3 is a simplified cross-sectional view of a transistor structure illustrating important aspects of the location of oxide layers in the structure of the present invention. The structure of FIG. 3 is incorporated in both the devices shown in FIG. 2a and 2b, and in the devices of FIGS. 10 and 11 which will be discussed below. In general, the structures include a first base junction 100 and a second base junction 102. The bipolar transistor structure, discussed thus far, is assumed to have two types of junctions: a collector-base junction and an emitter-base junction. These junctions will sometimes be referred to generically as "base junctions", it being understood that the identity of a junction (i.e., whether it is collector-base junction or emitter-base junction) will be determined by design considerations and whether the structure is to be an upside down or right side up transistor. However, the term "junction" is used in its most general sense to refer to the place at which the conductivity of a material changes either in the type of impurity, e.g., from P to N or vice versa, as in a bipolar transistor structure, or changes in doping concentration as in the so called high-low junction employed in uni-polar transistor structures.

In the bipolar embodiment, a base region of the structure of FIG. 3 may include an intrinsic base region as layer 104, and 106 and extrinsic (polysilicon) base region as region and 108 serving as a base contact to the base region 104. As used herein the term "extrinsic" refers to essentially inactive regions of the base, emitter or collector of a bipolar transistor, having the same conductivity type as the more active or "intrinsic" junction areas. As discussed in greater detail below, the extrinsic regions of the structure may be used to provide low resistance conduction paths to the intrinsic junction areas. The extrinsic material 108 may also provide impurities which are outdiffused into the intrinsic base regions 106 to increase their conductivity.

As will be described in greater detail below, the first base junction 100 and second base junction 102 of the structure of FIG. 3 may be self-aligned. As used herein two structures are said to be "self-aligned" when a first structure (oxide layer, diffused region, poly-silicon stripe, metalization, etc.) is aligned with a second structure without the use of a masking step.

The structure of FIG. 3 includes portions of a first oxide layer 110 and second oxide layer 112. The first oxide layer 110 shown in the Figure has an essentially vertical portion, while an essentially horizontal portion of the second oxide layer 112 is shown in the Figure. The terms "horizontal" and "vertical" are used with reference to a principal surface of the wafer on which the processing steps are performed. Typically this principal surface is the outer surface of an epitaxial silicon layer. Layers or regions are generally horizontal if their principal planes are generally parallel to the principal surface of the wafer. Similarly, layers or regions are generally vertical if they are generally perpendicular to the principal surface of the wafer.

It will readily be observed from FIG. 3 that the first base junction 100 terminates in the oxide layer 112. In other words, a peripheral edge boundary 114 of the first base junction 100 lies in contact with the oxide layer 112. The second base junction 102 terminates in the oxide layer 110 at boundary 116.

It will be clear from FIG. 3 that the oxide layers 110 and 112 define boundaries of the first and second base junctions. Because of the essentially overlying relationship of the boundaries 114 and 116, the areas of the first and second base junctions may be made nearly the same size and shape.

The junction edge at location 116 is a sharp junction which occurs in the single crystal epitaxial layer and which is not adjacent to poly-silicon material located in the extrinsic base region 108. It should be noted that were the junction 102 adjacent to the poly-silicon layer 108, excessive leakage would likely result. The second base junction 102 may be formed by outdiffusion of impurities from the poly-silicon material 109. This technique permits the self-alignment of the poly-silicon material with an intrinsic emitter 11 of the transistor structure (collector if an "upside-down" vertical bipolar transistor is being formed).

The general structure of FIG. 3 may also be useful in making unipolar transistors. In such a structure layer 104 could be lightly doped with an impurity of the same conductivity type as layers 111 and 113. The regions 106 could be heavily doped regions of the opposite conductivity type. Application of a suitable voltage to the regions 106 could be employed to pinchoff a conducting channel defined by layers 111, 104 and 113 and, thus, control the current through the device.

Steps in the manufacture of transistors based on the structure shown generally in FIG. 3 will now be described with sequential reference to FIGS. 4 through 10. The starting material for the process may be a wafer or substrate 151 lightly doped with an impurity. As in a conventional isoplaner bipolar transistor fabricating process, a doped epitaxial island 150 of single crystal silicon may be grown on a buried layer 152 of the same conductivity type. Islands of epitaxial material may be separated from one another by filed oxide regions 154 which surround the islands. During processing of the wafer, some of the impurities from the buried layer 152 may outdiffuse into the more lightly doped epitaxial region to form a more heavily doped region 156 of the epitaxial layer.

Figure 4:
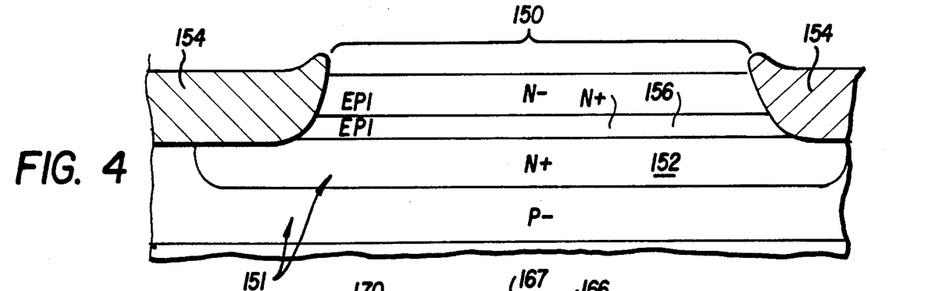
FIG. 4 is a cross-sectional vie wof an integrated circuit structure at an early stage of fabrication, at which a buried layer, epitaxial layer and isolation oxide layer have been formed on the semiconductor substrate.
Figure 5:
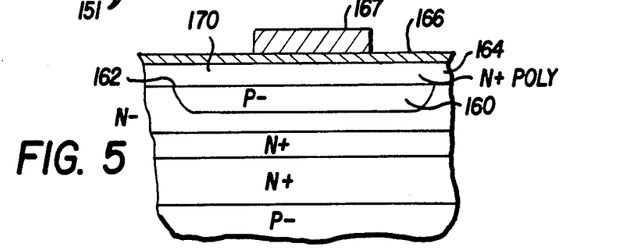
FIG. 5 is a cross-sectional view of the structure of FIG. 4 after steps have been performed to form an intrinsic base region, poly-silicon layer, silicide layer, and oxide mask.

With reference now to FIG. 5, an intrinsic base pocket 160 may be formed in the structure shown in FIG. 4. In the specific example shown in the Figures, a P type intrinsic base pocket is formed by ion implanation of P type impurities in the epitaxial layer. This doping process may result, for example, in the introduction of $10^{12}$ impurity atoms per square centimeter employing a driving energy of 140 KEV. The implantation is performed selectively through a mask to define the intrinsic base pocket which has edges 162.

Figure 6:
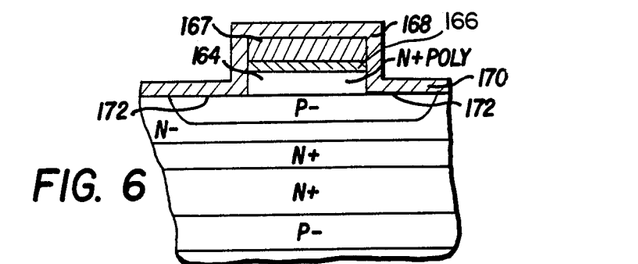
FIG. 6 is a cross-sectional view of the structure of FIG. 5 after etching and further oxide deposition.

As shown in FIG. 5, a layer of relatively heavily doped poly-silicon 164 may be deposited on the epitaxial layer followed by a silicide layer 166. The silicide layer may be formed by depositing a thin layer of a refractory metal, e.g. tantalum and forming a silicide thereof (tantalum silicide). A silicon dioxide etching mask 67, may be formed by conventional techniques. In moving from the structure of FIG. 5 to FIG. 6, the oxide layer 167 is employed as a mask to etch a mesa in the poly-silicon and silicide layers. Oxide may then be deposited to form a relatively thick oxide layer 168 (on the order of 3,000 Angstroms) around the poly-silicon layer 164 and on top of the oxide layer 167. It may be noted that the top of the mesa is a double layer of oxide.

Figure 7:
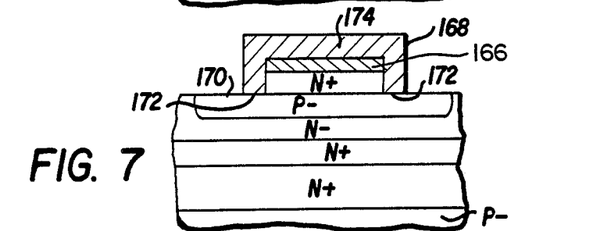
FIGS. 7 and 8 are cross-sectional views of the structure of FIG. 6 after further etching has been performed.

As illustrated in FIG. 7, the oxide layer may be anisotropically etched by a plasma process. The etch may be timed so that it is sufficient to remove all the oxide ont he epitaxial layer surface 170 but insufficient to remove the double layer of oxide on top of the mesa. The foregoing process produces a collar-shaped structure 174 having substantially flat, horizontal wall edges 172. The vertical walls of the collar are preserved during the anisotropic etch.

Figure 8:
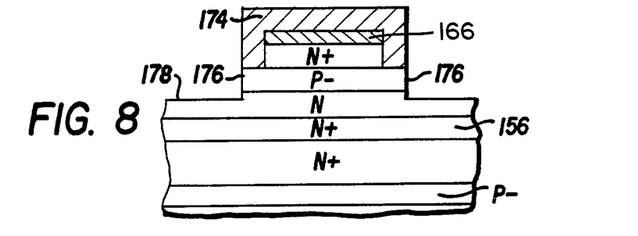

As shown in FIG. 8, continued anisotropic plasma etching may be employed to expose generally vertical faces or walls 176 of the epitaxial layer. The walls may lie on either side of the collar 174. The etching may continue until the surface 178 of the epitaxial layer at the etching front nearly reaches the outdiffused epitaxial region 156. In this way an etched mesa is formed in the epitaxial layer, the horizontal area of the mesa being defined by the oxide collar 174 acting as a mask.

Figure 9:
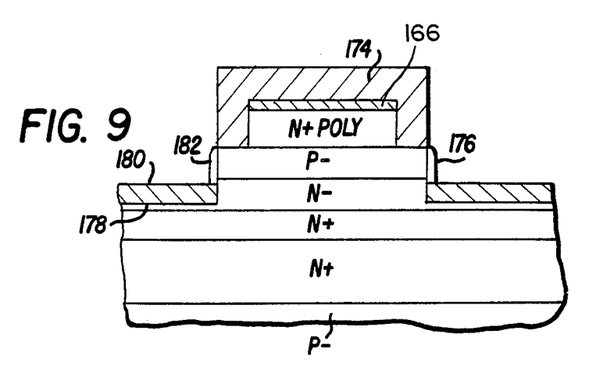
FIG. 9 is a cross-sectional view of the structure of FIG. 8 illustrating the anisotropic formation of an oxide layer.

As shown in FIG. 9, a layer of oxide may now be formed on the newly etched surface 178 of the epitaxial layer. In one embodiment of the present invention, this layer of oxide 180 is formed by ion implanting oxygen anisotropically so that no substantial amount of oxide is formed on the generally vertical side walls 176. The driving trajectory of the oxide ions is selected so that the oxide ions generally do not impact the vertical walls 176. To the extent that a small amount of undesired oxide 182 is formed on the vertical side walls, this oxide may be removed by a flash etch which is of insufficient intensity or duration to substantially affect the oxide layer 180 or the oxide collar 174.

Figure 9A:
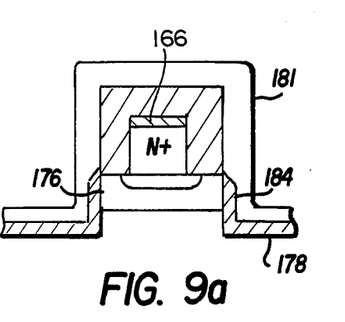
FIGS. 9a and 9b illustrate an alternative procedure for forming the oxide layer shown in FIG. 9.
Figure 9B:
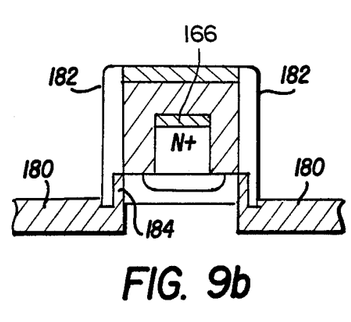

An alternative method for anisotropically producing the oxide layer 180 is illustrated in FIGS. 9a and 9b. As shown in FIG. 9a a thin layer of silicon oxide 184 may be grown isotropically on the surface of the epitaxial layer 178 and on the vertical wall 176. A silicon nitride layer 181 may then be deposited over the entire structure. As shown in FIG. 9b the silicon nitride may be anisotropically etched in a conventional manner leaving only vertical silicon nitride layers 182. The silicon nitride may then act as a mask during the isotropic growth of additional silicon oxide which builds up to form the oxide layer 180. The silicon nitride walls 182 may then be selectively etched away. Finally, a flash etch of, for example, hydrochloric acid may be employed to remove any remaining portion of the thin silicon oxide layer 184. The resulting structure will be similar to that shown in FIG. 9.

Figure 10:
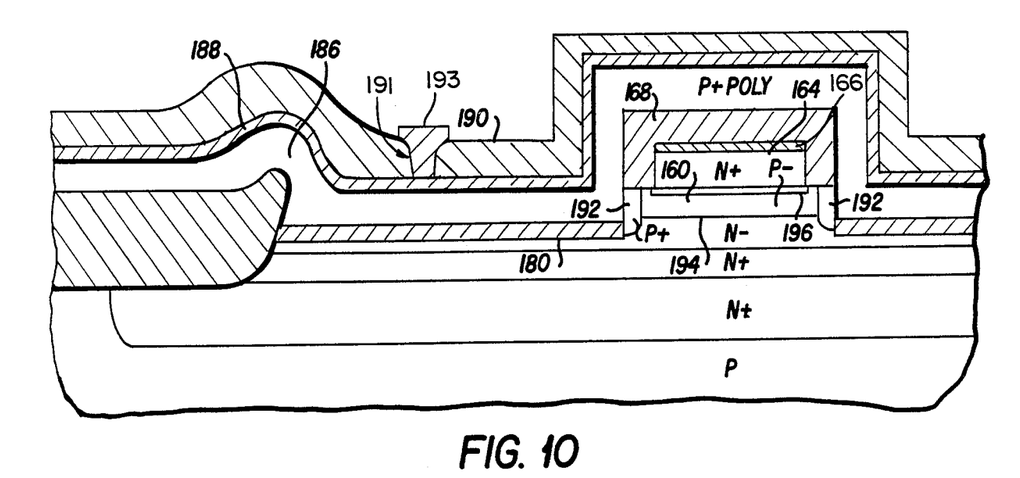
FIG. 10 is a cross-sectional view of a completed transistor structure.

FIG. 10 illustrates the completed transistor structure and the final processing steps employed to produce that structure. A second poly-silicon layer 186 may be deposited on the structure shown in FIG. 9. This second poly-silicon layer may be heavily doped with an impurity of the opposite conductivity type (here P type). In the finished device this poly-silicon layer may act as an extrinsic base and as a conductor for base current. Alternatively, a metal layer could be deposited in place of the poly-silicon layer to reduce base contact resistance.

A second silicide layer 188 may be formed on the second poly-silicon layer 186 to further reduce base resistance. The typical resistivity of such a silicide layer may be on the order of 5 ohms per square as compared to approximately 100 ohms per square for the P+ poly which the silicide overlies. The result is a low resistance path from the active base junction area to contact metalization.

A final layer of oxide 190 may be formed over substantially the entirety of the surface of the wafer to passivate the surface of the device. Openings may be etched in this oxide layer and in selected underlying areas in order to provide windows 191 (see also FIG. 2c) through which electrical contacts 193 may be made to the various structures therebeneath.

The structure may be treated in order to cause additional diffusion to occur. More specifically, the structure may be heated causing outdiffusion from the first poly-silicon layer 164 into the intrinsic base region 160 to form the emitter region 111. Similarly the second poly-silicon layer 186 may outdiffuse into the epitaxial layer forming a secondary intrinsic base region 192 at the periphery of the intrinsic base region 160.

Thus, a first base junction 194 (here the collector junction) is limited or bounded by the horizontal oxide layer 180. A second base junction 196 (here the emitter-base junction) terminates in the oxide layer 168. It is important to note by employing the foregoing fabrication scheme the second junction 196 terminates in the oxide layer 168 and is not in a poly-silicon layer. This consideration is important with regard to emitter efficiency and current gain of the double-poly transistor structure.

Figure 11A:
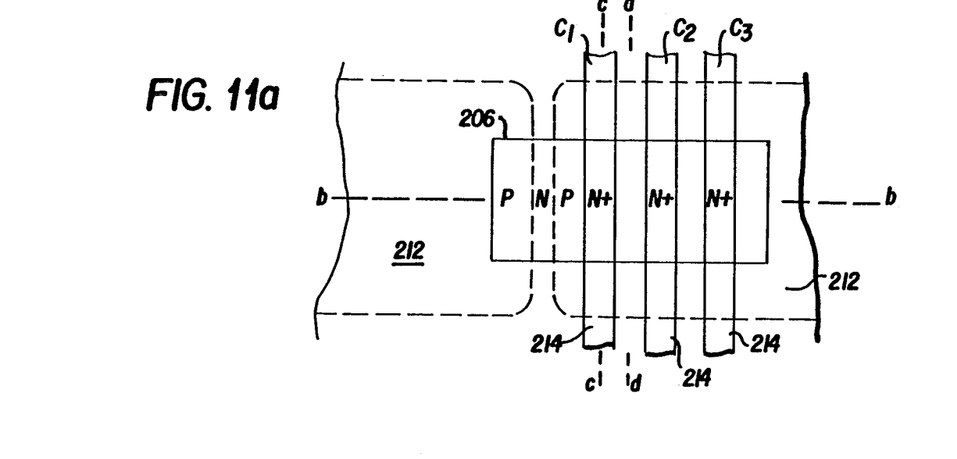
FIG. 11a is a plan view of the structure.
Figure 11B:
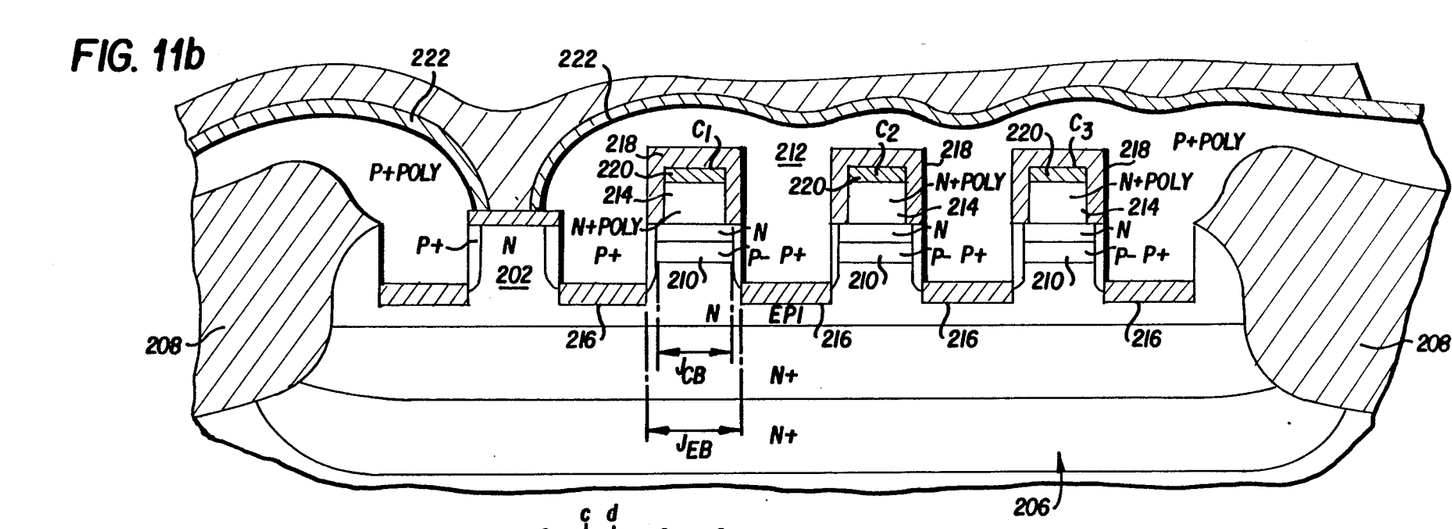
FIGS. 11b, 11c and 11d are cross-sectional views of that structure taken along planes b—b, c—c and d—d, respectively.
Figure 11C:
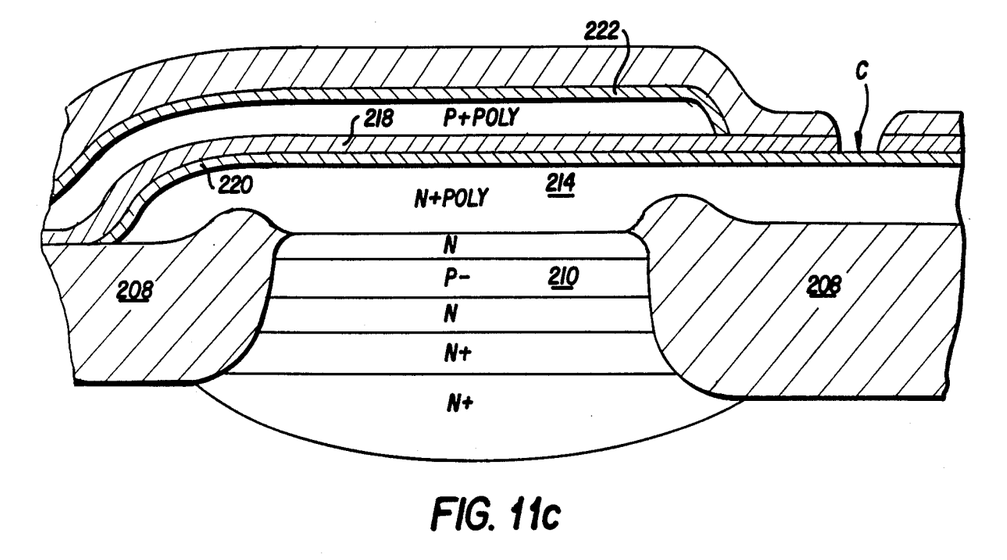
Figure 11D:
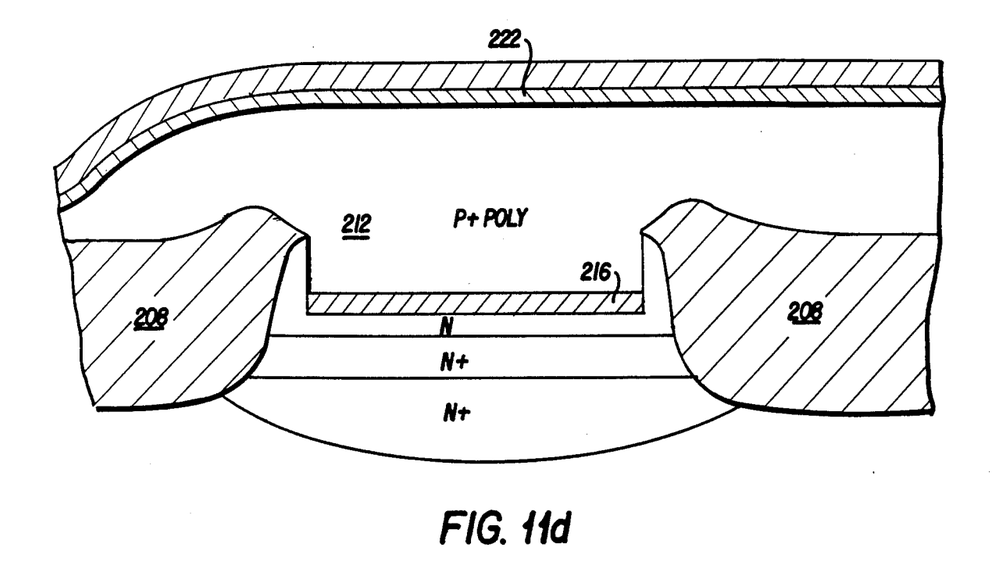
Figure 12:
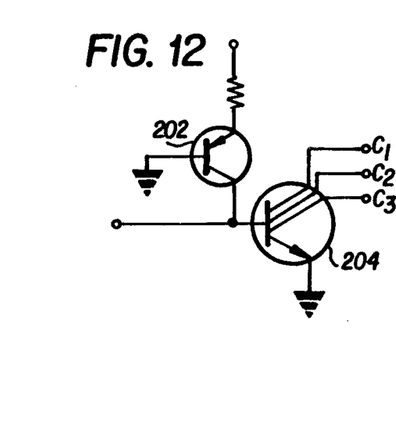
FIG. 12 is a schematic circuit diagram of an I²L logic circuit which can be made employing the structure of FIGS. 11a through 11d.

The foregoing fabrication techniques may be employed to form the multiple collector double-poly transistor structure shown in FIGS. 11a through 11d, which may be used as a component of the $I^2L$ logic circuit illustrated schematically in FIG. 12. The $I^2L$ circuit may include a horizontal pnp transistor 202 and an inverted or upside down vertical npn transistor 204 with multiple collectors ($C_1$, $C_2$ and $C_3$ in the example shown).

Three cross-sectional views of the structure (FIGS. 11b, 11c and 11d) are taken along planes b—b, c—c and d—d, respectively, of FIG. 11a. In these figures, like features are identified with like numerals. The transistor structures may be formed in an epitaxial island 206 surrounded by a field oxide layer 208. An intrinsic base pocket may be formed in the island 206, portions 210 of which, remain in the completed structure and are electrically contacted by a P+ poly-silicon layer 212. The collectors are formed by out diffusion of N+ poly-silicon ribs 214 into mesas formed in the epitaxial layer. Oxide layers 216 and 218 define boundaries of the emitter-base junctions $J_{EB}$ and the collector-base junctions $J_{CB}$ respectively, of the npn transistor. The oxide layer 216 also defines boundaries of the emitter-base and collector-base junctions of the horizontal pnp transistor 202. Silicide layers 220 and 222 may be provided to reduce resistance between various of the active structures in the wafer.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made to those skilled in the art without departing from the spirit of the invention.

I claim:

1. A method of making a bipolar transistor structure in an island of a first conductivity type epitaxial layer, the island being surrounded by insulating mateiral, said epitaxial layer being separated from a substrate of opposite conductivity type by a buried layer of the first conductivity type, the method comprising the steps of:
   introducing a pocket of opposite conductivity type impurity into the epitaxial layer to form an intrinsic base region of the transistor structure;
   depositing a first poly-silicon layer of the first conductivity type onto a defined surface area of the pocket;
   depositing a first oxide layer covering exposed surfaces of the first poly-silicon layer;
   etching an area of the epitaxial layer to expose a generally vertical wall of the epitaxial layer around the first oxide layer;
   forming anisotropically a generally horizontal second oxide layer which leaves exposed at least a portion of the generally vertical wall;
   depositing a second poly-silicon layer containing an impurity of the opposite conductivity type onto the surface of the structure, so that the second poly-silicon layer contacts the exposed portion of the generally vertical wall; and
   treating the sturcture to cause at least some of the impurity in the first poly-silicon layer to enter the pocket, and to cause at least some of the impurity in the second poly-silicon layer to enter the epitaxial layer through the exposed, generally vertical wall whereby a first junction of the transistor structure is formed, an edge of said first junction terminating in the second oxide layer, and whereby a second junction of the transistor structure is formed, an edge of the second junction terminating in the first oxide layer.

2. The method of claim 1 wherein the horizontal oxide layer is formed by implanting oxygen anisotropically in the etched area of the epitaxial layer around the first oxide layer.

3. The method of claim 1 wherein the first and second junctions are of substantially the same shape and area.

4. The method of claim 3 wherein the second junction horizontally overlies the first junction in approximately parallel relationship.

5. The method of claim 4 further comprising the step of depositing a first silicide layer on the first poly-silicon layer prior to the deposition of the first oxide layer.

6. The method of claim 5 further comprising the steps of:
   depositing a second silicide layer on the second poly-silicon layer;
   depositing a passivation oxide layer on said silicide layer, and
   etching windows in the structure to provide electrical contact to the first and second poly-silicon layers, said windows being located in portions of the structure which do not overlie the junctions.

7. The method of claim 6 further comprising the step of depositing a conductive metal layer adapted to make contact to the windows and adapted to make contact with the second poly-silicon layer as a base contact of the transistor structure.

8. The method of claim 7 wherein a conductive metal layer contacts a window to the first poly-silicon layer to form an emitter contact of the transistor structure.

9. The method of claim 7 wherein a conductive metal layer contacts the first poly-silicon layer through a window to form a collector contact of the transistor structure.

10. The method of claim 9 wherein multiple collectors are formed in the transistor structure and the transistor structure is adapted for incorporation in an integrated injection logic device.

11. A method of making a self-aligned bipolar transistor structure in an island of a first conductivity type epitaxial layer which is surrounded by insulating material, comprising the steps of:
    introducing a pocket of opposite conductivity type impurity into the epitaxial layer to form a base region of the transistor structure;
    depositing a first poly-silicon layer of the first conductivity type onto a defined surface are of the pocket;
    depositing a first oxide layer over the first poly-silicon layer;
    etching the epitaxial layer to expose a generally vertical wall of the epitaxial layer;
    forming a generally horizontal second oxide layer which leaves exposed at least a portion of the generally vertical wall;
    depositing a second poly-silicon layer containing an impurity of the opposite conductivity type onto the surface of the structure, so that the second poly-silicon layer contacts the exposed portion of the generally vertical wall; and
    treating the structure to cause at least some of the impurity in the first poly-silicon layer to enter the pocket and thereby define a device region, and to cause at least some of the impurity in the second poly-silicon layer to enter the epitaxial layer through the exposed, generally vertical wall whereby a first junction of the transistor structure is formed between said base region and said epitaxial layer, an edge of said first junction terminating in the second oxide layer, and whereby a second junction of the transistor structure is formed between said base region and said device region, an edge of the second junction terminating in the first oxide layer.

12. The method of claim 11 wherein the first and second junctions are of substantially the same shape and area.

13. The method of claim 12 wherein the second junction horizontally overlies the first junction in approximately parallel relationship.

14. The method of claim 11 further comprising the step of depositing a first silicide layer on the first poly-silicon layer prior to the deposition of the first oxide layer.

15. The method of claim 14 further comprising the steps of:
   depositing a second silicide layer on the second poly-silicon layer;
   depositing a passivation oxide layer on said silicide layer; and
   etching windows in the structure to provide elecrical contact to the first and second poly-silicon layers.

16. The method of claim 15 further comprising the step of depositing a conductive metal layer which contacts the second poly-silicon layer through one of said windows to form a base contact of the transistor structure.

* * * * *